Dec. 29, 1970 D. E. GRIFFEY 3,551,821

ARC TRIGGER SQUELCH FOR A TELEVISION RECEIVER

Filed March 21, 1969

INVENTOR
DONALD E. GRIFFEY
BY Mueller, Aichele & Rauner
ATTYS.

United States Patent Office 3,551,821
Patented Dec. 29, 1970

3,551,821
ARC TRIGGER SQUELCH FOR A TELEVISION RECEIVER

Donald E. Griffey, Skokie, Ill., assignor to Motorola, Inc., Franklin Park, Ill., a corporation of Illinois
Filed Mar. 21, 1969, Ser. No. 809,116
Int. Cl. H02h 7/20
U.S. Cl. 328—8 6 Claims

ABSTRACT OF THE DISCLOSURE

A circuit for preventing cathode ray tube arcs from acting as a trigger to initiate breakdown or arc-over on the printed circuit board of a television receiver is provided in the form of voltage limiting resistors connected in series in the input leads between the input terminals of the cathode ray tube and the printed circuit board outputs. The resistors are provided in the cathode, G–1, G–2, and G–3 leads for the cathode ray tube and are physically located away from the printed circuit board on an additional printed circuit board; so that the high voltage, caused by cathode ray tube arc-over, at the end of the resistor connected to the cathode ray tube input is isolated from the television receiver printed circuit board by the series resistor.

BACKGROUND OF THE INVENTION

In the manufacture of television receivers, it has proven advantageous to provide the major portion of the signal processing circuitry on printed circuit boards, since printed circuit boards result in manufacturing economies and provide a means for miniaturization of the television set by permitting more efficient utilization of the space within the cabinet. The use of printed circuit boards, however, has resulted in problems of burned circuit boards and some component destruction as a result of the unavoidable cathode ray tube arcs which occasionally occur in the operation of the cathode ray picture tube of the television set. Due to the close proximity of the printed circuit leads on the board, the high voltages appearing on the input terminals of the cathode ray tube, and consequently applied over the connecting leads to the output terminals on the printed circuit board, in some instances are sufficient to trigger a breakdown of the B++ potential on some of the board leads to adjoining printed circuit ground leads. The resulting arc-over on the printed circuit board leads causes burning of the printed circuit board base material, destroying the board, or in other instances causes damage to components mounted on the boards.

In order to overcome the problem of circuit board burning triggered by C.R.T. arc-over, spark gaps have been wired onto the printed circuit board in order to provide a discharge path for the high voltage due to the C.R.T. arcing. Such spark gaps, however, create an undesirable audible noise when they fire. In addition, when the high voltage electrolytic capacitor discharges through such a spark gap after being triggered by a C.R.T. arc, cathode ray tube spot burns can occur due to the very fast discharge or fall of the B++ to ground which takes out the sweep signals while the high voltage and the cathode ray beam current remain.

It also has been proposed to provide voltage limiting resistors on the circuit board in series with circuit board outputs to the cathode ray tube input terminals. Even though the resistance values of these series resistors are sufficient theoretically to provide sufficient protection for the high voltage arcing caused by the arc-over in the cathode ray tube, in actual practice, however, the protection expected has not been realized and burning of the printed circuit boards and component destruction continued to occur with some regularity.

SUMMARY OF THE INVENTION

Accordingly it is an object of this invention to limit the voltage applied to any of the leads on a printed circuit board due to the occurrence of an arc-over in the cathode ray tube of a television receiver.

It is another object of this invention to prevent the triggering of high voltage breakdown across the leads of a printed circuit board in the presence of arc-over in the cathode ray tube of a television receiver.

In accordance with a preferred embodiment of this invention, cathode ray tube arc trigger squelching is accomplished by connecting a voltage limiting resistor in series between the output of the printed circuit board and the input to the cathode ray tube with at least the end of the resistor which is connected to the cathode ray tube being physically located off the printed circuit board.

DETAILED DESCRIPTION

Figure 1:
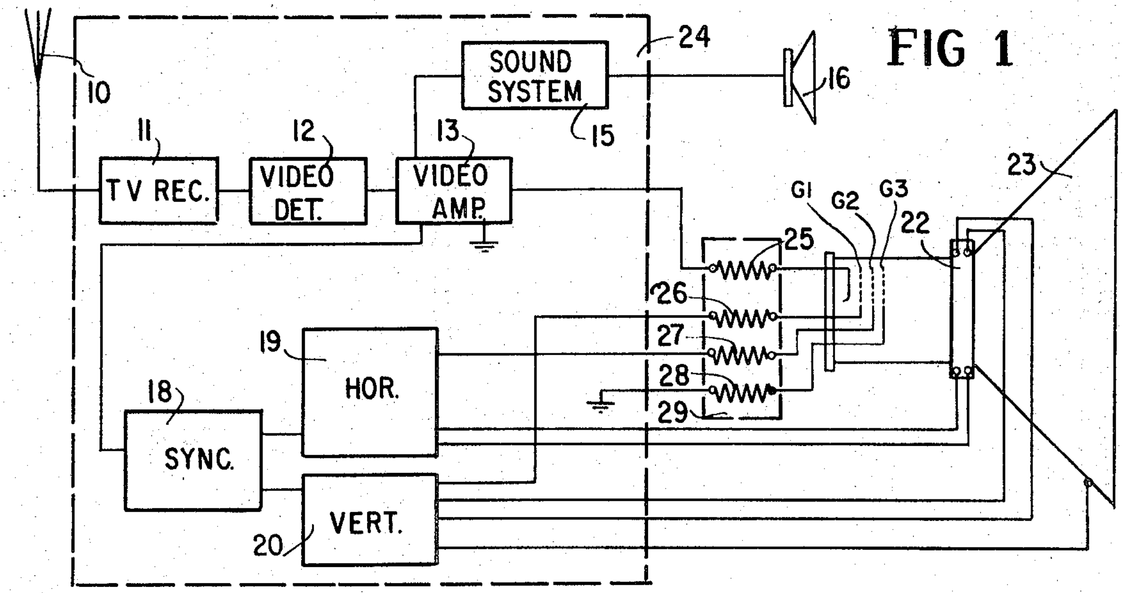
FIG. 1 is a circuit diagram, partially in block form, illustrating a preferred embodiment of this invention.

Referring now to FIG. 1 of the drawing, there is shown a television receiver 11 coupled to a suitable antenna 10 for receiving a television signal and for selecting, amplifying and converting the ratio frequency signal to IF frequency for application to a video detector 12. The output of the video detector 12 is applied to a video amplifier 13 from which signals for a sound system 15 are derived. The sound system 15 then demodulates and amplifies the 4.5 mHz. sound subcarrier for reproduction by a speaker 16 as the audio signals of the received composite signals applied by the antenna 10 to the receiver 11.

In addition, the video amplifier 13 supplies signals to a synchronizing stage 18, the output of which controls the operation of horizontal and vertical circuits 19 and 20. Outputs from the horizontal and vertical circuits are applied to a deflection yoke 22 of a cathode ray picture tube 23 to provide the necessary horizontal and vertical sweep voltages. In addition, an output of the horizontal circuit 19 provides for a high voltage for the screen of the final anode or ultor of the cathode ray tube 23 in a conventional manner. Other outputs from the horizontal circuit include the control potentials for the control grid G1 and focussing grid G2 of the cathode ray tube 23. These are indicated generally in FIG. 1 by the upper two output leads from the horizontal circuit 19. The G3 grid of the cathode ray tube 23 is connected to ground potential obtained from a lead on a printed circuit board 24.

The components of the signal processing stages including the receiver stages 11, the sound system 15, the detector and amplifier stages 12 and 13, along with the horizontal and vertical circuits 19 and 20 are located on the printed circuit board 24, that is, the components for these circuits are mounted on and wired together by the printed circuit board 24. Of course it should be noted that the horizontal output transformer and some external control potentiometers and inductances are not mounted on the printed circuit board 24; but for the purposes of illustration in FIG. 1, however, it may be assumed that the major portion of the electronic components of the television receiver are mounted on one or more interconnected printed circuit boards 24.

In the use of the printed circuit board 24 for supplying signals to a cathode ray tube, such as the cathode ray tube 23, a problem has arisen due to the high voltage which appears on the cathode or the G1, G2, G3 output terminals of the cathode ray tube due to arc-over which occasionally occurs in the cathode ray tube. This high voltage then triggers arc-over from one printed circuit lead on the printed circuit board 24 to adjacent leads which may result in burning of the circuit board itself or in damage of some of the circuit components mounted on the board.

Figure 2:
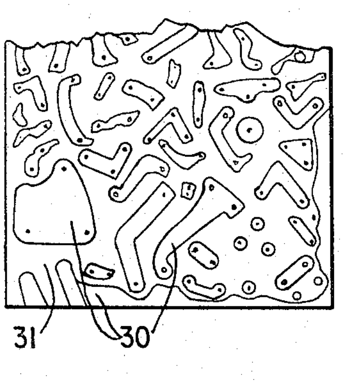
FIG. 2 is a partial view of the underside of a printed circuit board of the type used in the circuit shown in FIG. 1.

Referring to FIG. 2, there is shown a partially cutaway view of the underside of a printed circuit board 24 showing the metalized areas 30 which constitute the conductors on the printed circuit board separated by non-conductive areas 31. From an examination of FIG. 2, it may be seen that in order to provide the maximum packing density of the components on the circuit board 24 and to obtain the most efficient utilization of the circuit board, the metalized leads 30 on the board are located in very close proximity to one another. Thus, any time a high potential difference exists between adjacent leads, there exists a possibility for a destructive arc-over between such leads.

In order to overcome this problem and to isolate high voltage appearing on the input pins or terminals of the cathode ray tube 23 from appearing on any part of the printed circuit board 24, a plurality of isolating resistors 25, 26, 27, and 28 are connected in series in the leads extending from the printed circuit board 24 to the cathode and G1, G2, and G3 grids of the cathode ray tube 23. The resistor 25 is connected in series between the output of the video amplifier 13 and the cathode of the cathode ray tube 23, the resistor 26 is connected between the vertical circuit 20 and the G1 input terminal, the resistor 27 is connected in series between the output of the horizontal circuit 19 and the G2 input terminal, and the resistor 28 is connected between a ground lead on the circuit board 24 and the G3 input terminal of the cathode ray tube 23. Preferably, these resistors are mounted on a second or additional printed circuit board 29, although they may be independently connected directly in the leads extending from the printed circuit board 24 to the cathode ray tube 23 without the use of the printed circuit board 29.

Since the arc-over from one metalized area 30 of the printed circuit board to another metalized area 30 thereon could still occur if the resistors 25, 26, 27 and 28 were mounted on the printed circuit board 24, it is desirable to physically space the location of these resistors away from the printed circuit board so that no high voltage due to arc-over in the cathode ray tube 23 is applied to any portion of this printed circuit board 24. This physical spacing or location of the printed circuit board 29 carrying the resistors 25 to 28 may best be seen in the illustration of FIG. 3.

Figure 3:
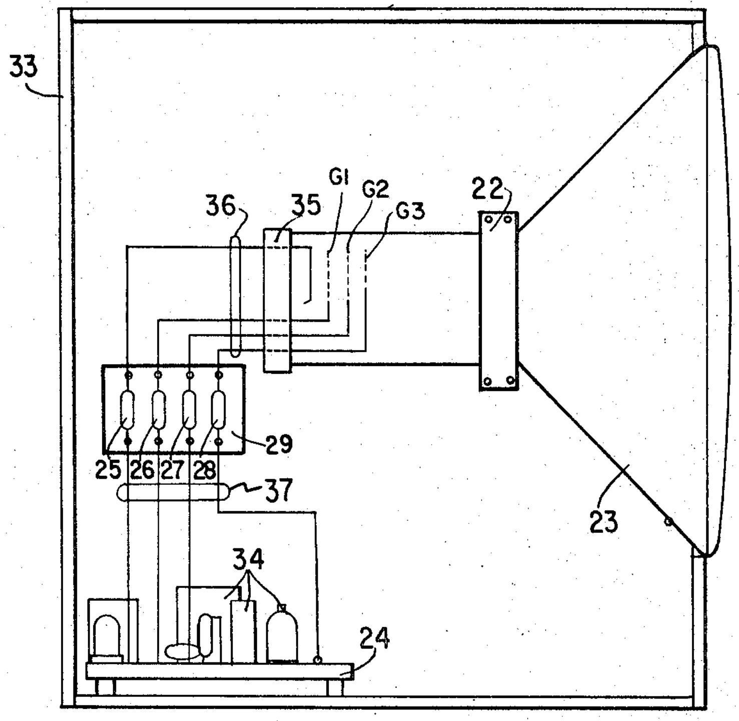
FIG. 3 is a diagramatic side-view of a television receiver showing the location of arc trigger squelch resistors mounted in accordance with a preferred embodiment of this invention.

In FIG. 3 a television chassis 33 has mounted thereon near the rear and on its bottom the printed circuit board 24 carrying the television processing circuitry and components. The board 24 may be mounted in the chassis 33 in any suitable manner and it carries thereon a plurality of components 34 in the form of resistors, capacitors, tubes and/or transistors which form the typical components of a conventional television receiver. At the front of the chassis 33, the cathode ray picture tube 23 is mounted for external viewing by a viewer. The neck of the tube 23 and the tube socket 35 into which the cathode ray tube input pins are inserted is located a substantial distance from the circuit board 24 carrying the signal processing components 34.

Normally, a plurality of leads are connected from the printed circuit board 24 directly to the tube socket 35 in order to apply the signals from the receiver circuits to the cathode ray tube 23. In FIG. 3, however, the second circuit board 29 is shown physically located between the tube socket 35 and the printed circuit board 24, with the leads 36 extending from the tube socket 35 being connected to respective end terminals of the resistors 25, 26, 27, and 28. The other ends of the resistors 25 to 28 are connected through a corresponding series of leads 37 to the outputs on the printed circuit board 24.

The location of the circuit board 29 is such as to physically space ends of the resistors 25 to 28 which are connected to the C.R.T. input terminals of the socket 35 away from the printed circuit board 24 by a distance sufficient to prevent high voltage due to arc-over in the cathode ray tube 23 from being applied by the leads 36 to the circuit board 24. The resistors 25 to 28 are chosen to be of sufficient magnitude to prevent the application of any harmful high voltage over the leads 37 to the printed circuit board 24. If so desired, the leads 37 could be eliminated, with the lower terminals of the resistors 25 to 28 (as viewed in FIG. 3) being connected directly to the circuit board 24, provided the upper (high voltage) ends of the resistors are spaced off the board 24.

As stated previously, the resistors 26 to 28 also could be mounted without being placed on a separate printed circuit board 29, in which event one end of these resistors could be connected directly to the pins on the tube socket 35 or could be connected thereto over a short lead with the leads 37 then being wired directly from the printed circuit board 24 to the other ends of the resistors 25 to 28. Whether or not the circuit board 29 is used, at least ends of the resistors 25 to 28 connected to the C.R.T. input terminals must be physically spaced away from the circuit board 24 a distance sufficient to prevent the high voltage appearing on these ends from being in close enough proximity to the printed circuit wiring 30 to trigger arc-over on the closely packed printed circuit wiring 30 of the printed circuit board 24.

What is claimed is:

1. In a television receiver having a cathode ray tube and having at least some components mounted on a printed circuit board with output connections therefrom over leads extending to the inputs of the cathode ray tube, said cathode ray tube having a cathode and a plurality of grids and being subject to arc-over causing the appearance of high-voltage on at least one of the leads from the printed circuit board, said high-voltage being of a magnitude sufficient to trigger arc-over on the printed circuit wiring of said printed circuit board, an arc trigger squelch circuit including in combination: a resistor connected in series in at least one of the leads subject to said high-voltage and at least the end of which is connected to the input of the cathode ray tube being located physically off said printed circuit board, the distance of said end of the resistor from said board and the magnitude of the resistor being sufficient to limit the voltage appearing at the opposite end connected to the printed circuit board to a value which is insufficient to trigger arc-over on the printed circuit wiring upon the occurrence of an arc in the cathode ray tube.

2. The combination according to claim 1 wherein at least two of the leads extending from the output connections on the printed circuit board to the inputs of the cathode ray tube terminate at the end remote from the board in one end of a respective first and second series resistors the other ends of which are connected to different inputs to the cathode ray tube and are spaced from the printed circuit board, the series resistors being of a magnitude sufficient to limit the voltage appearing at the end of the lead connected to the printed circuit board to a value which is insufficient to trigger arc-over on the printed circuit wiring of the board in the presence of an arc-over in the cathode ray tube.

3. The combination according to claim 2 wherein the first and second series resistors are mounted on a second printed circuit board and wherein said second printed circuit board is located in the television receiver to effect said spacing of the other ends of the resistors from the first printed circuit board.

4. The combination according to claim 1 wherein each of the lead extending to the grids of the cathode ray tube includes a resistor connector in series therewith with at least the ends of the resistors which are connected to the inputs of the cathode ray tube being located physically off the printed circuit board, the distance of said ends of each of the resistors being sufficient to reduce the voltages appearing at the opposite ends of the resistors connected to the printed circuit board to a magnitude which is insufficient to trigger arc-over the printed circuit wiring in the presence of an arc in the cathode ray tube.

5. The combination according to claim 4 wherein the cathode ray tube has at least first, second and third grids and a cathode, with first, second, third and fourth resistors connected, respectively, to the first, second and third grids and the cathode of the cathode ray tube, and further including a second printed circuit board on which the resistors are mounted.

6. The combination according to claim 5 wherein the first printed circuit board is mounted in the chassis of the television receiver in a location which is a predetermined distance from the input connections to the cathode ray tube and wherein the second printed circuit board carrying the first, second, third and fourth resistors is mounted between the first printed circuit board and the input terminals of the cathode ray tube.

References Cited

UNITED STATES PATENTS 2,755,377 7/1956 Tissot ---------------- 328—10

OTHER REFERENCES

German Auslegeschrift 1,141,350 to Nobis, October 1960, 1 sht. dwg., 4 pps., spec., 328–10.

JAMES D. KALLAM, Primary Examiner

R. F. POLISSACK, Assistant Examiner

U.S. Cl. X.R.

315—35; 328—9, 10; 317—31, 101, 103